US012408431B2

(12) United States Patent
Zhang et al.

(10) Patent No.: US 12,408,431 B2
(45) Date of Patent: Sep. 2, 2025

(54) GATE STACK QUALITY FOR GATE-ALL-AROUND FIELD-EFFECT TRANSISTORS

(71) Applicant: INTERNATIONAL BUSINESS MACHINES CORPORATION, Armonk, NY (US)

(72) Inventors: Jingyun Zhang, Albany, NY (US); Takashi Ando, Tuckahoe, NY (US); Choonghyun Lee, Rensselaer, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/662,865

(22) Filed: Oct. 24, 2019

(65) Prior Publication Data

US 2021/0126018 A1 Apr. 29, 2021

Related U.S. Application Data

(62) Division of application No. 15/947,411, filed on Apr. 6, 2018, now Pat. No. 10,566,435.

(51) Int. Cl.
*H01L 27/12* (2006.01)
*H10D 30/67* (2025.01)
(Continued)

(52) U.S. Cl.
CPC ....... *H10D 86/215* (2025.01); *H10D 30/6735* (2025.01); *H10D 64/516* (2025.01);
(Continued)

(58) Field of Classification Search
CPC ............. H01L 29/66795; H01L 29/785; H01L 27/1211; H01L 29/42368; H01L 29/42392; H10D 86/215; H10D 30/6735; H10D 64/516; H10D 84/0144; H10D 84/038; H10D 30/6736; H10D 30/014;
(Continued)

(56) References Cited

U.S. PATENT DOCUMENTS 7,576,395 B2 8/2009 Jung et al.
7,663,166 B2 * 2/2010 Kim .................... H01L 29/0657 257/288

(Continued)

OTHER PUBLICATIONS

Misra et al., "3. Field Effect Transistors" (2005) pp. 109-126.*
List of IBM Patents or Patent Applications Treated as Related dated Oct. 24, 2019, 2 pages.

*Primary Examiner* — Jay C Kim
(74) *Attorney, Agent, or Firm* — Tutunjian & Bitetto, P.C.; Samuel Waldbaum

(57) ABSTRACT

A semiconductor device includes a first gate-all-around field-effect transistor (GAA FET) device including a first gate stack having first channels and dielectric material including first and second portions having respective thicknesses formed around the first interfacial layers. The semiconductor device further includes a second GAA FET device including a second gate stack having second channels and the dielectric material formed around the second interfacial layers. A threshold voltage (Vt) shift associated with the semiconductor device is achieved based on a thickness of the first portion of the dielectric material.

4 Claims, 11 Drawing Sheets

100
130a
132a
200a
122a
210a
124a
120a
126a
110a
102a
130b
132b
200b
122b
210b
124b
120b
126b
110b
102b

(51) Int. Cl.
*H10D 64/27* (2025.01)
*H10D 84/01* (2025.01)
*H10D 84/03* (2025.01)
*H10D 86/00* (2025.01)

(52) U.S. Cl.
CPC ....... *H10D 84/0144* (2025.01); *H10D 84/038* (2025.01); *H10D 30/6736* (2025.01)

(58) Field of Classification Search
CPC .. H10D 30/43; H10D 30/6757; H10D 62/121; H10D 64/01; H10D 64/685; H10D 84/83; B82Y 10/00
USPC .......................................................... 257/401
See application file for complete search history.

(56) References Cited

U.S. PATENT DOCUMENTS 8,298,881 B2 * 10/2012 Sleight .................. H01L 29/775 438/151
8,658,518 B1 * 2/2014 Chang ..................... H01L 29/16 438/479
8,722,492 B2 * 5/2014 Bangsaruntip ........ H01L 21/047 438/279
8,865,538 B2 10/2014 Clark
9,035,277 B2 * 5/2015 Ching ................... H01L 21/845 257/9
9,048,183 B2 6/2015 Ganguli et al.
9,171,843 B2 * 10/2015 Ching ............... H01L 29/78618
9,318,553 B1 * 4/2016 Cheng ................. H01L 29/0673
9,362,397 B2 * 6/2016 Hur ................... H01L 29/66484
9,608,116 B2 * 3/2017 Ching ............. H01L 21/823481
9,613,866 B2 4/2017 Ando et al.
9,647,098 B2 * 5/2017 Obradovic .......... H01L 21/8252
9,673,279 B2 * 6/2017 Lee ..................... H01L 29/6656
9,685,371 B2 6/2017 Zope et al.
9,685,522 B1 * 6/2017 Kim .................. H01L 21/28088
9,728,619 B2 * 8/2017 Bangsaruntip ...... H01L 29/0665
9,748,404 B1 * 8/2017 Chang ............... H01L 29/66772
9,899,416 B2 * 2/2018 Kim .................... H01L 29/0673
9,997,519 B1 * 6/2018 Bao ..................... H01L 29/4966
10,026,652 B2 * 7/2018 Wang ................ H01L 21/82345
10,103,065 B1 * 10/2018 Mochizuki ............ H01L 29/401
10,109,534 B2 * 10/2018 Brand ................... H01L 29/785
10,128,379 B2 * 11/2018 Song ................. H01L 29/42392
10,163,729 B2 * 12/2018 Ching ............... H01L 29/66439
10,204,985 B2 * 2/2019 Lee ................... H01L 29/78696
10,276,452 B1 * 4/2019 Seshadri ........... H01L 21/28185
10,304,936 B2 * 5/2019 Loubet ................ H01L 29/1037
10,319,846 B1 * 6/2019 Ando ................ H01L 21/82380
10,374,034 B1 * 8/2019 Liu ................... H01L 21/02186
10,374,059 B2 * 8/2019 Cheng ................. H01L 29/0847
10,381,490 B2 * 8/2019 Kim ...................... H01L 27/088
10,396,152 B2 * 8/2019 Cheng ................. H01L 29/0673
10,414,978 B2 * 9/2019 Kim ........................ H01L 29/78
10,461,167 B2 * 10/2019 Lee ................... H01L 21/82345
10,475,898 B2 * 11/2019 Chung .............. H01L 21/28088
10,553,679 B2 * 2/2020 Zhang .............. H01L 29/66439
10,559,566 B1 * 2/2020 Lee ......................... H01L 29/78
10,566,435 B2 * 2/2020 Zhang ............. H01L 21/823462
10,573,521 B2 * 2/2020 Wang ................ H01L 29/66742
10,643,899 B2 * 5/2020 Zhang ............. H01L 21/823456
10,672,742 B2 * 6/2020 Wu ................ H01L 21/823807
10,692,778 B2 * 6/2020 Bao ................ H01L 21/823821
10,692,866 B2 * 6/2020 Ando .................. H01L 21/3215
10,700,064 B1 * 6/2020 Zhang ..................... H01L 29/78
10,714,391 B2 * 7/2020 Smith .................... B82Y 10/00
10,720,431 B1 * 7/2020 Cheng ................. H01L 21/3086
10,734,286 B1 * 8/2020 Ando .................. H01L 29/0673
10,741,660 B2 * 8/2020 Loubet .............. H01L 21/28158
10,763,177 B1 * 9/2020 Zhang ............. H01L 21/823462
10,832,960 B2 * 11/2020 Zhang ................... H01L 21/324
10,833,078 B2 * 11/2020 Smith ............. H01L 21/823842
10,872,983 B2 * 12/2020 Yang ................... H01L 29/1033
10,910,375 B2 * 2/2021 Ching ................. H01L 29/0673
10,978,299 B2 * 4/2021 Noh .................. H01L 29/42392
11,049,937 B2 * 6/2021 Cheng .................... B82Y 10/00
11,127,819 B2 * 9/2021 Liaw ..................... H01L 29/785
11,133,305 B2 * 9/2021 Ando ................ H01L 21/28088
11,133,309 B2 * 9/2021 Zhang ................. H01L 21/3115
11,152,264 B2 * 10/2021 Zhang ............... H01L 29/42392
11,164,796 B2 * 11/2021 Cheng ................. H01L 29/4966
11,205,650 B2 * 12/2021 Huang ............ H01L 21/823857
11,244,871 B2 * 2/2022 Chiang ................. H01L 29/785
11,282,939 B2 * 3/2022 Lee ................... H01L 29/66439
11,296,078 B2 * 4/2022 Lee ................... H01L 29/78684
11,329,136 B2 * 5/2022 Bao ..................... H01L 29/0673
11,495,662 B2 * 11/2022 Liaw ................... H01L 27/0924
11,705,503 B2 * 7/2023 Kim .................. H01L 29/66636 257/288
11,710,667 B2 * 7/2023 Hsu ................... H01L 29/78391 257/295
2017/0104060 A1 * 4/2017 Balakrishnan .............................. H01L 21/823412
2017/0200738 A1 * 7/2017 Kim .................. H01L 29/66439
2017/0256544 A1 * 9/2017 Chai ..................... H01L 29/401
2018/0158836 A1 * 6/2018 Kim .................. H01L 29/42392
2018/0308768 A1 * 10/2018 Mochizuki .......... H01L 29/4908
2020/0035678 A1 * 1/2020 Lee ..................... H01L 29/1079
2020/0235133 A1 * 7/2020 Xiao ................. H01L 29/78696
2020/0343376 A1 * 10/2020 Chiang ................. H01L 27/088
2020/0343387 A1 * 10/2020 Liaw ..................... H01L 27/088
2020/0365612 A1 * 11/2020 Hu .................... H01L 29/41741
2020/0373300 A1 * 11/2020 Zhang ............... H01L 29/78696
2021/0036144 A1 * 2/2021 Liaw ............... H01L 21/823807
2021/0098589 A1 * 4/2021 Cheng ............... H01L 29/78696
2021/0098605 A1 * 4/2021 Wang ................ H01L 29/66636

* cited by examiner

GATE STACK QUALITY FOR GATE-ALL-AROUND FIELD-EFFECT TRANSISTORS

BACKGROUND

The present invention generally relates to semiconductor devices, and more particularly to gate-all-around field-effect transistors and methods of fabricating thereof.

A gate-all-around (GAA) field effect transistor (FET) is a FET in which the gate is placed on all four sides of a channel of the FET. GAA FETs can reduce problems associated with channel width variations, including but not limited to undesired variability and mobility loss.

SUMMARY

In accordance an embodiment of the present invention, a method for fabricating a semiconductor device is provided. The method includes forming a first metal oxide layer on a first portion of dielectric material formed around channels of a first gate stack of a first gate-all-around field-effect transistor (GAA FET) device and around channels a second gate stack of a second GAA FET device. The first, portion of dielectric material is formedduring a first deposition process. The method further includes performing an anneal process after forming the first metal oxide layer to achieve a threshold voltage (Vt) shift based on a thickness of the first portion of the dielectric material.

In accordance with another embodiment of the present invention, a method for fabricating a semiconductor device is provided. The method includes forming a first portion of dielectric material on interfacial layers formed around channels of a first gate stack of a first gate-all-around field-effect transistor (GAA FET) device and on interfacial layers formed around channels of a second gate stack of a second GAA FET device. The first portion of the dielectric material is formed during a first deposition process. The method further includes performing a first anneal process after forming the first portion of the dielectric material, forming first and second sacrificial layers within the first and second gate stacks, respectively, forming a first metal oxide layer on each of the first and second sacrificial layers, forming a first protective layer on each of the first metal oxide layers, removing the first protective layers and the first sacrificial layer along with the first metal oxide layer formed on the first sacrificial layer, forming a second metal oxide layer on the first portion of the dielectric material of the first GAA FET device and on the first metal oxide layer of the second GAA FET device, forming second protective layers on the second metal oxide layers, forming layers including amorphous silicon (a-Si) on the second protective layers, performing a second anneal process after forming the layers including a-Si to achieve a threshold voltage (Vt) shift based on a thickness of the first portion of the dielectric material, removing all layers from the first GAA FET device and the second GAA FET device up to the first portion of the dielectric material, and forming a second portion of the dielectric material on the first portion of the dielectric material during a second deposition process to complete the dielectric material formation on the interfacial layers.

In accordance with yet another embodiment of the present invention, a semiconductor device is provided. The device includes a first gate-all-around field-effect transistor (GAA FET) device including a first gate stack having first channels and dielectric material including first and second portions having respective thicknesses formed around the first interfacial layers. The semiconductor device further includes a second GAA FET device including a second gate stack having second channels and the dielectric material formed around the second interfacial layers. A threshold voltage (Vt) shift associated with the semiconductor device is achieved based on a thickness of the first portion of the dielectric material.

In accordance with yet another embodiment of the present invention, a semiconductor device is provided. The device includes a first gate-all-around field-effect transistor (GAA FET) device including a first gate stack having first channels, interfacial layers formed around the first channels, and dielectric material including first and second portions having respective thicknesses formed around the first interfacial layers. The device further includes a second GAA FET device including a second gate stack having second channels, the interfacial layers formed around the second channels, and the dielectric material formed around the second interfacial layers. A threshold voltage (Vt) shift associated with the semiconductor device is achieved based on a thickness of the first portion of the dielectric material.

In accordance with yet another embodiment of the present invention, a semiconductor device is provided. The device includes a first gate-all-around field-effect transistor (GAA FET) device including a first gate stack having first channels, interfacial layers formed around the first channels, and dielectric material including first and second portions having respective thicknesses formed around the first interfacial layers. The device further includes a second GAA FET device including a second gate stack having second channels, the interfacial layers formed around the second channels, and the dielectric material formed around the second interfacial layers. The first and second channels have a thickness between about 4 nm to about 8 nm, the first and second interfacial layers have a thickness between about 0.5 nm to about 1.5 nm, the first and second portions of the dielectric material have a combined thickness between about 1 nm to about 3 nm, and a threshold voltage (Vt) shift associated with the semiconductor device is achieved based on a thickness of the first portion of the dielectric material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
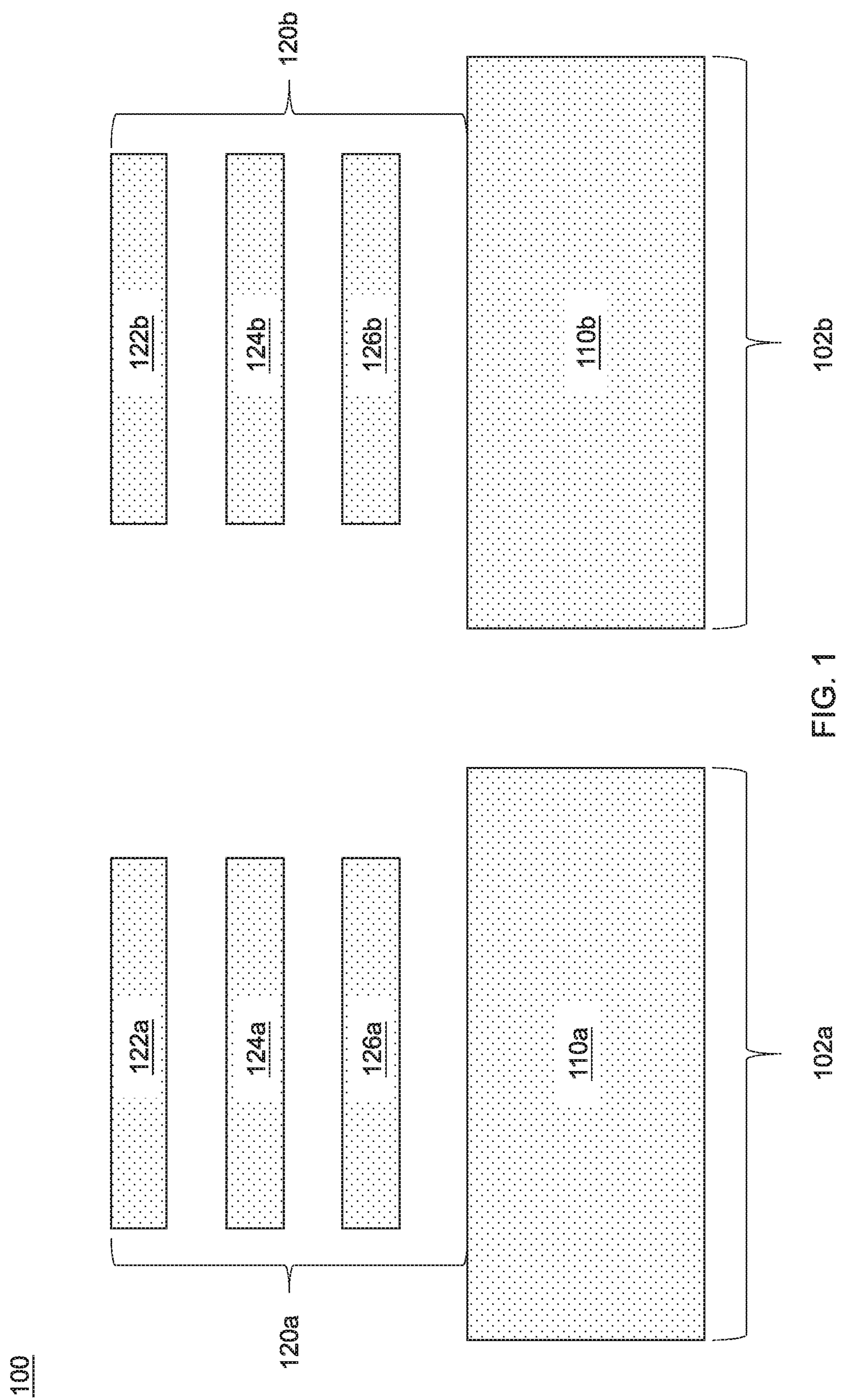
FIG. 1 is a cross-sectional view of post channel release of channels of gate stacks of devices during the fabrication of a semiconductor device, in accordance with an embodiment of the present invention.

Due to limited spacing between gate stack channels, conventional gate stack channels do not have a run-path to simultaneously achieve reliability anneal and multi-threshold voltage (Vt). The reliability anneal process can include depositing a capping layer, performing a spike anneal, and then removing the capping layer. Such gate stack channels can be in the form of nanosheets composed of one or more semiconductor materials. For example, the nanosheets can be composed of silicon (Si).

The embodiments described herein provide for the formation of dielectric material on interfacial layers (ILs) formed on gate stack channels of GAA FET devices in separate dielectric material deposition processes, as opposed to a single dielectric material deposition process. For example, the dielectric layer formed during a first dielectric material deposition process will have a thickness less than a total thickness for the dielectric material, and the dielectric layer formed on the first dielectric layer during a second dielectric material deposition process will have a thickness such that the combined thickness of the dielectric layers is equal to about the total thickness. In one embodiment, the total thickness can be from about 1 nm to about 3 nm, the dielectric layer formed during the first dielectric material deposition process can have a thickness of about 0.5 nm to about 2 nm, and the dielectric layer formed during the second dielectric material deposition process can have a thickness of about 0.5 nm to about 1 nm. In an illustrative example, if the total thickness is about, e.g., 2 nm, the dielectric layer formed during the first dielectric material deposition process can have a thickness of about 1 nm, and the dielectric layer formed during the second dielectric material deposition process can have a thickness of about 1 nm. However, such thicknesses should not be considered limiting.

By separating the formation of the dielectric material into separate dielectric material deposition processes, reliability annealing and multi Vt processing of GAA FETs at low thermal budget can be achieved. The reduced thermal budget can prevent IL regrowth for the GAA FET devices. A first one of the GAA FET devices can be a device with dipole engineering to modulate Vt, and a second one of the GAA FET devices can be a device without dipole engineering, which will have a different Vt from the first GAA FET device.

To simultaneously achieve the reliability annealing and multi-Vt, the embodiments described herein can use a modified high-k dielectric profile along with a laser anneal, although any dielectric and anneal process can be employed in accordance with the embodiments described herein. The improved gate stack quality for GAA FETs realized by the embodiments described herein can provide further benefits regarding negative-bias temperature instability (NBTI) and inversion-layer thickness ($T_{inv}$) of the gate stack.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements, FIGS. 1-11 depict respective steps of a process flow for fabricating semiconductor devices to improve gate-stack quality for GAA FETs.

Referring to FIG. 1, a cross-sectional view showing an exemplary semiconductor device 100 during post channel release is provided. As shown, the device 100 includes a GAA FET device 102*a* and a GAA FET device 102*b*. In one embodiment, the GAA FET device 102*a* is a device with dipole engineering to modulate Vt, and the GAA FET device 102*b* is a device without dipole engineering, which will have a different Vt from the first GAA FET device.

The GAA FET device 102*a* includes a substrate 110*a* and the GAA FET device 102*b* includes a substrate 110*b*. In one embodiment, the substrates 110*a* and 110*b* include Si, although the materials of the substrates 110*a* and 110*b* should not be considered limiting. The substrates 110*a* and 110*b* can include any suitable substrate structure, e.g., a bulk semiconductor, a semiconductor-on-insulator (SOI) substrate, etc. In one example, at least one of the substrates 110*a* and 110*b* can include a silicon-containing material. Illustrative examples of Si-containing materials suitable for the substrate can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The GAA FET device 102*a* includes a gate stack 120*a* that includes a plurality of channels, including channels 122*a*, 124*a* and 126*a*. The GAA FET device 102*b* includes a gate stack 120*b* that includes a plurality of channels, including channels 122*b*, 124*b* and 126*b*.

As shown, the channels 122*a*-126*a* and the channels 122*b*-126*b* have surrounding material removed, but are supported at locations not depicted in the cross-sectional view.

In one embodiment, each of the channels 122*a*-126*a* and 122*b*-126*b* is formed from a nanosheet. One or more of the nanosheets can include Si. However, any material suitable for use as a channel material can be used in accordance with the embodiments described herein. Illustratively, the thickness of each channel can be between about 4 nm to about 8 nm, and the spacing between each channel, also referred to herein as inter-channel spacing, can be between about 8 nm to about 13 nm. More specifically, the thickness of each channel can be about 6 nm, and the spacing between each channel, also referred to herein as inter-channel spacing, can be about 11 nm.

Figure 2:
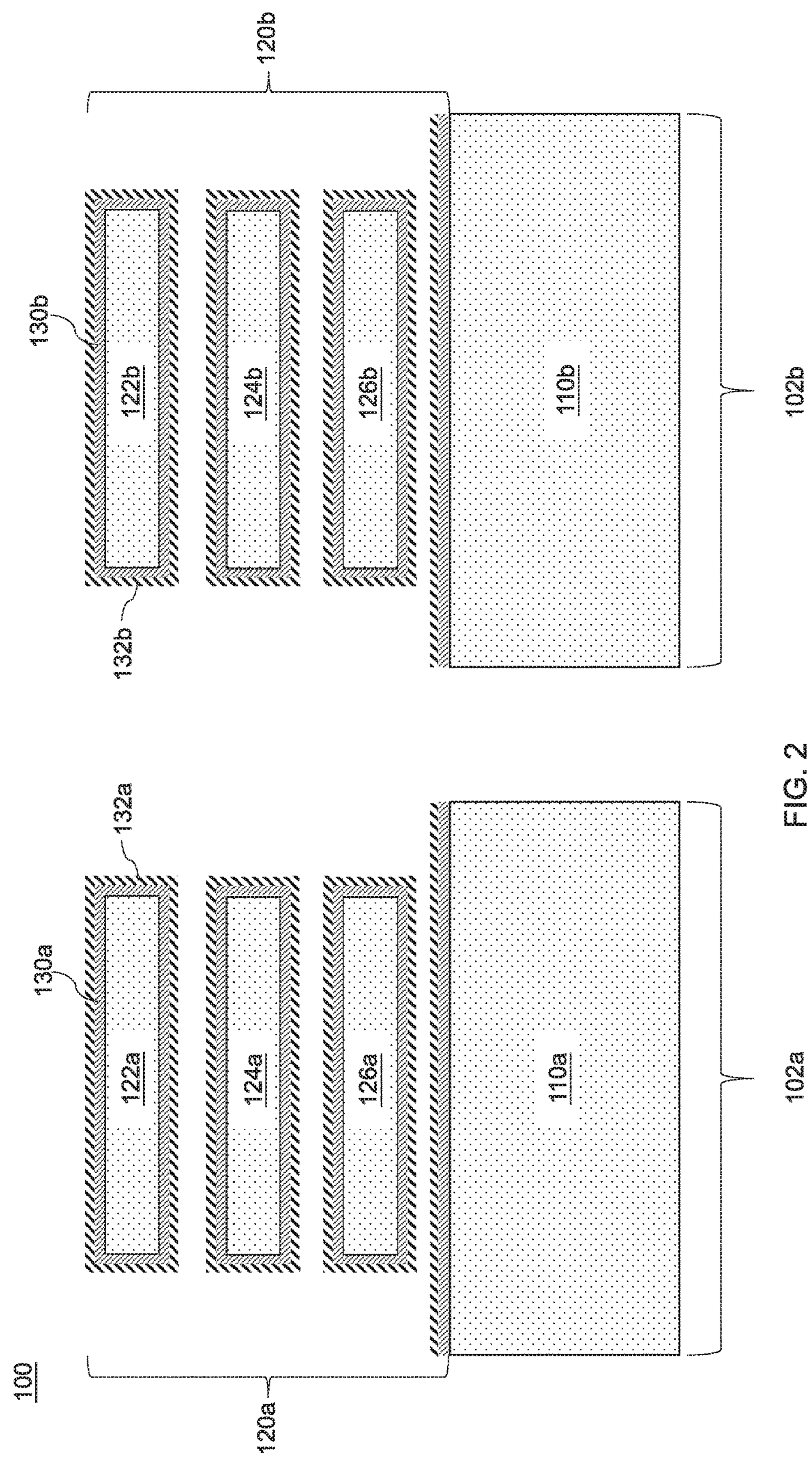
FIG. 2 is a cross-sectional view of layers formed on the channels during the fabrication of the semiconductor device, in accordance with an embodiment of the present invention.

Referring to FIG. 2, an interfacial layer (IL) 130*a* is formed around each of the channels 122*a*-126*a* and on the surface of the substrate 110*a*, dielectric material 132*a* is formed on the IL 130*a*, an IL 130*b* is formed around each of the channels 122*a*-126*b* and on the surface of the substrate 110*b*, and dielectric material 132*b* is formed on the ILs 130*b*. ILs 130*a* and 130*b* and dielectric materials 132*a* and 132*b* can be formed employing any deposition process and/or etching process suitable for use in accordance with the embodiments described herein (e.g., atomic layer deposition (ALD)).

The ILs 130*a* and 130*b* can include any material suitable for use as an IL. Such materials may include, but are not limited to, silicon dioxide ($SiO_2$), hafnium silicates, and silicon oxynitrides. The dielectric materials 132*a* and 132*b* can include high-k dielectric material, although any type of dielectric material can be used in accordance with the embodiments described herein. A high-k dielectric material is a dielectric material having a dielectric constant (k) higher than the dielectric constant of silicon dioxide ($SiO_2$) at room temperature (20° C.-25° C.) and atmospheric pressure (1 atm). Such high-k dielectric materials may include, but are not limited to, hafnium oxides, hafnium silicates, titanium oxides, barium-strontium-titantates (BSTs) and lead-zirconate-titanates (PZTs).

As previously mentioned, instead of forming all the dielectric material on the ILs 130*a* and 130*b* in a single dielectric material deposition process, the embodiments described herein separate the formation of the dielectric material on the ILs 130*a* and 130*b* into two separate dielectric material deposition processes. Thus, the dielectric materials 132*a* and 132*b* correspond to a first portion of the dielectric material formed on the ILs 130*a* and 130*b* during a first dielectric material deposition process.

In one embodiment, the dielectric material formed around the ILs 130*a* and 130*b* can have a total thickness (e.g., a total thickness of the first portion of the dielectric material and a second portion of the dielectric material) of between about 1 nm to about 3 nm. More specifically, in one embodiment, the total thickness is about 2 nm.

The thickness of the dielectric material formed during the first deposition process, dielectric materials 132*a* and 132*b*, is less than the total thickness. In one embodiment, the thickness of the ILs 130*a* and 130*b* can be between about 0.5 nm to about 1.5 nm, the thickness of the dielectric materials 132*a* and 132*b* can be between about 0.5 nm to about 2 nm, and the inter-channel spacing is reduced by about 1 nm to about 3.5 nm. For example, in the embodiment in which the total thickness is about 1.7 nm, the thickness of each of the ILs 130*a* and 130*b* can be about 0.7 nm, the thickness of the dielectric materials 132*a* and 132*b* can be about 1 nm, and the inter-channel spacing is reduced by about 3.4 nm.

The thickness of the dielectric material formed during the first deposition process, dielectric materials 132*a* and 132*b*, can be chosen to provide advantages over conventional GAA FET fabrication processes. For example, the thickness of the dielectric materials 132*a* and 132*b* should be sufficiently small to reduce or prevent crystallization during an annealing process performed after the dielectric materials 132*a* and 132*b* are formed on the ILs 130*a* and 130*b*. Performing the annealing process on the dielectric materials 132*a* and 132*b* having a sufficiently small thickness and without a capping layer can improve bias temperature instability (BTI). For example, in one embodiment, the annealing process is a laser annealing process, such as laser spike annealing (LSA). The LSA can be performed at about 1200 degrees Celsius, and can be performed without a capping layer. However, any suitable anneal process can be performed in accordance with the embodiments described herein.

Figure 3:
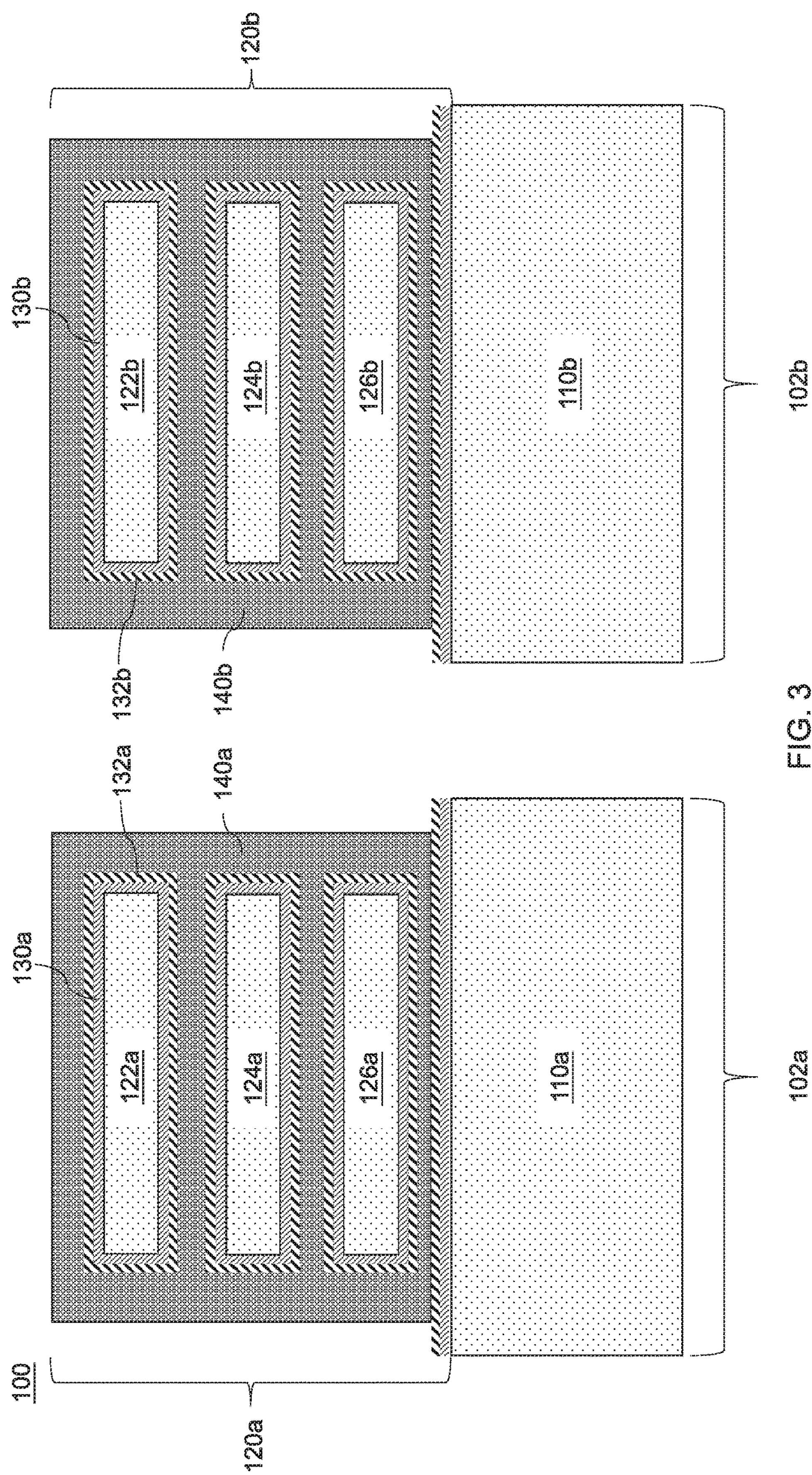
FIG. 3 is a cross-sectional view of diffusion barriers formed within gaps in the gate stacks during the fabrication of the semiconductor device, in accordance with an embodiment of the present invention.

Referring to FIG. 3, a sacrificial layer 140*a* is formed surrounding the gate stack 120*a* and a sacrificial layer 140*b* is formed surrounding the gate stack 120*b*. In one embodiment, the sacrificial layers 140*a* and 140*b* include titanium nitride (TiN), although any suitable material can be used in accordance with the embodiment described herein. Other examples of materials that the sacrificial layers 140*a* and 140*b* can include are TaN, TiAlC, etc. The sacrificial layers 140*a* and 140*b* can be formed using any suitable process in accordance with the embodiments described herein. The sacrificial layers 140*a* and 140*b* should have a thickness to pinch-off the gap. In one embodiment, the sacrificial layers 140*a* and 140*b* can each have a thickness between about 4 nm to about 6 nm. More specifically, in the case that the formation of the ILs 130*a* and 130*b* and the dielectric material 132*a* and 132*b* reduces the inter-channel spacing by about 3.4 nm, the sacrificial layers 140*a* and 140*b* can each have a thickness of about 4 nm.

Figure 4:
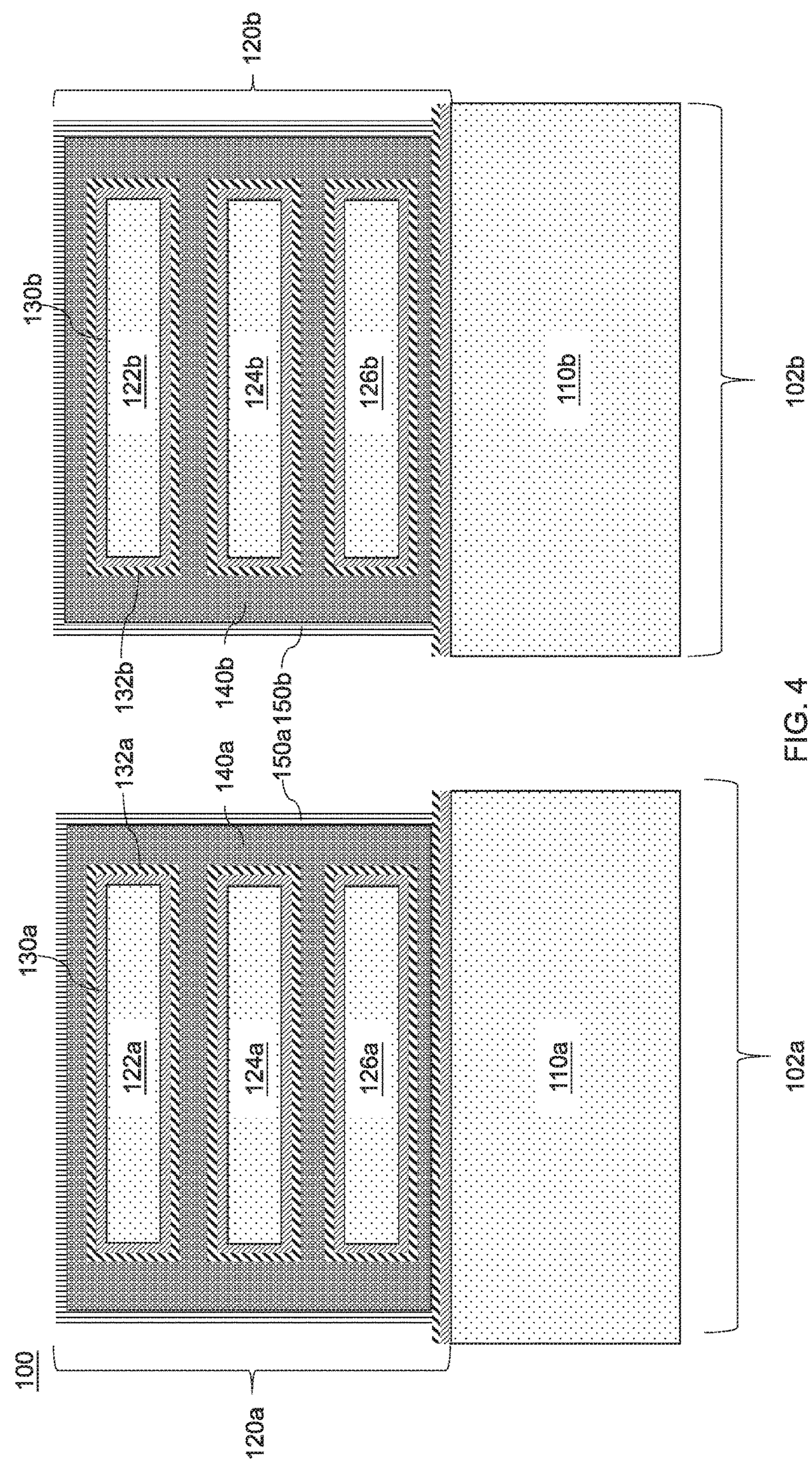
FIG. 4 is a cross-sectional view of layers formed on the diffusion barriers during the fabrication of the semiconductor device, in accordance with an embodiment of the present invention.

Referring to FIG. 4, a metal oxide layer 150*a* is formed on the sacrificial layer 140*a* and a metal oxide layer 150*b* is formed on the sacrificial layer 140*b*. In one embodiment, the metal oxide layers 150*a* and 150*b* include transition metal oxides. Transition metal oxides are compounds that include oxygen atoms bound to transition metals. Non-limiting examples of metal oxides that metal oxide layers 150*a* and 150*b* can include are $La_2O_3$, $Y_2O_3$, $Al_2O_3$, $Lu_2O_3$, $MgO_2$, etc. The metal oxide layers 150*a* and 150*b* can be formed using any suitable process in accordance with the embodiments described herein. In one embodiment, the dielectric layers 150*a* and 150*b* can each have a thickness of between about 0.5 nm to about 2 nm.

Figure 5:
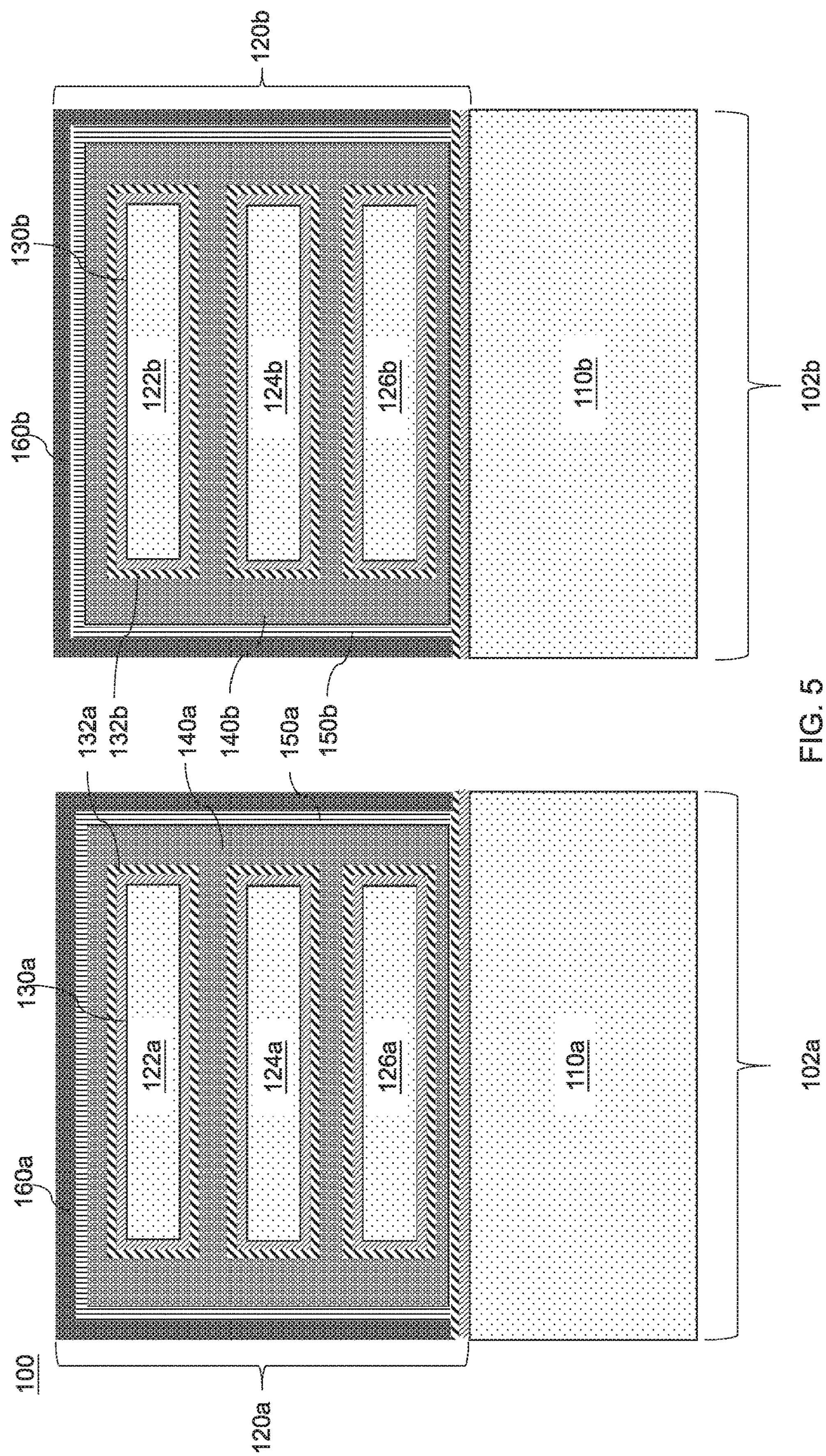
FIG. 5 is a cross-sectional view of additional layers formed on the layers formed on the diffusion barriers during the fabrication of the semiconductor device, in accordance with an embodiment of the present invention.

Referring to FIG. 5, a protective layer 160*a* is formed on the metal oxide layer 150*a* and a protective layer 160*b* is formed on the metal oxide layer 150*b*. The protective layers 160*a* and 160*b* function to protect and provide connectivity to the metal oxide layers 150*a* and 150*b*, respectively. In one embodiment, the protective layers 160*a* and 160*b* include metal organic TiN (Mo—TiN). However, the protective layers 160*a* and 160*b* can include any suitable material in accordance with the embodiments described herein. For example, the protective layers 160*a* and 160*b* can include Mo—TaN, Mo—TiAlC, etc. Each of the protective layers 160*a* and 160*b* can have a thickness from about 1 nm to about 2 nm. More specifically, in one embodiment, each of the protective layers 160*a* and 160*b* can have a thickness of about 1.5 nm.

Figure 6:
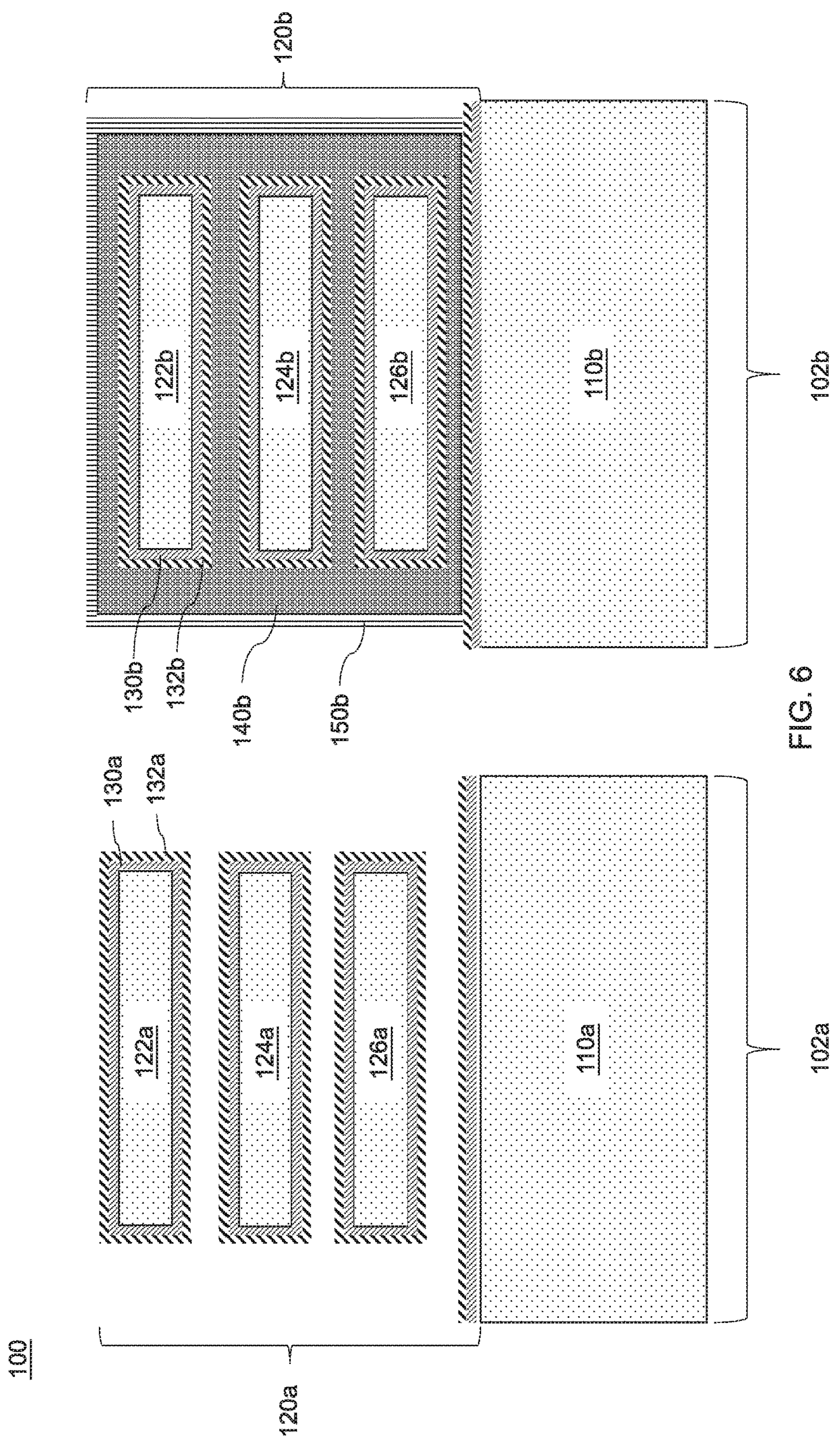
FIG. 6 is a cross-sectional view of material removed during the fabrication of the semiconductor device, in accordance with an embodiment of the present invention.

Referring to FIG. 6, an etch process is performed to remove the layers 140*a*-160*a* from the GAA FET device 102*a*, and the protective layer 160*b* from the GAA FET device 102*b*. The dielectric layer 150*b* functions as a hard mask to stop the etch process with respect to the GAA FET device 102*b*.

Figure 7:
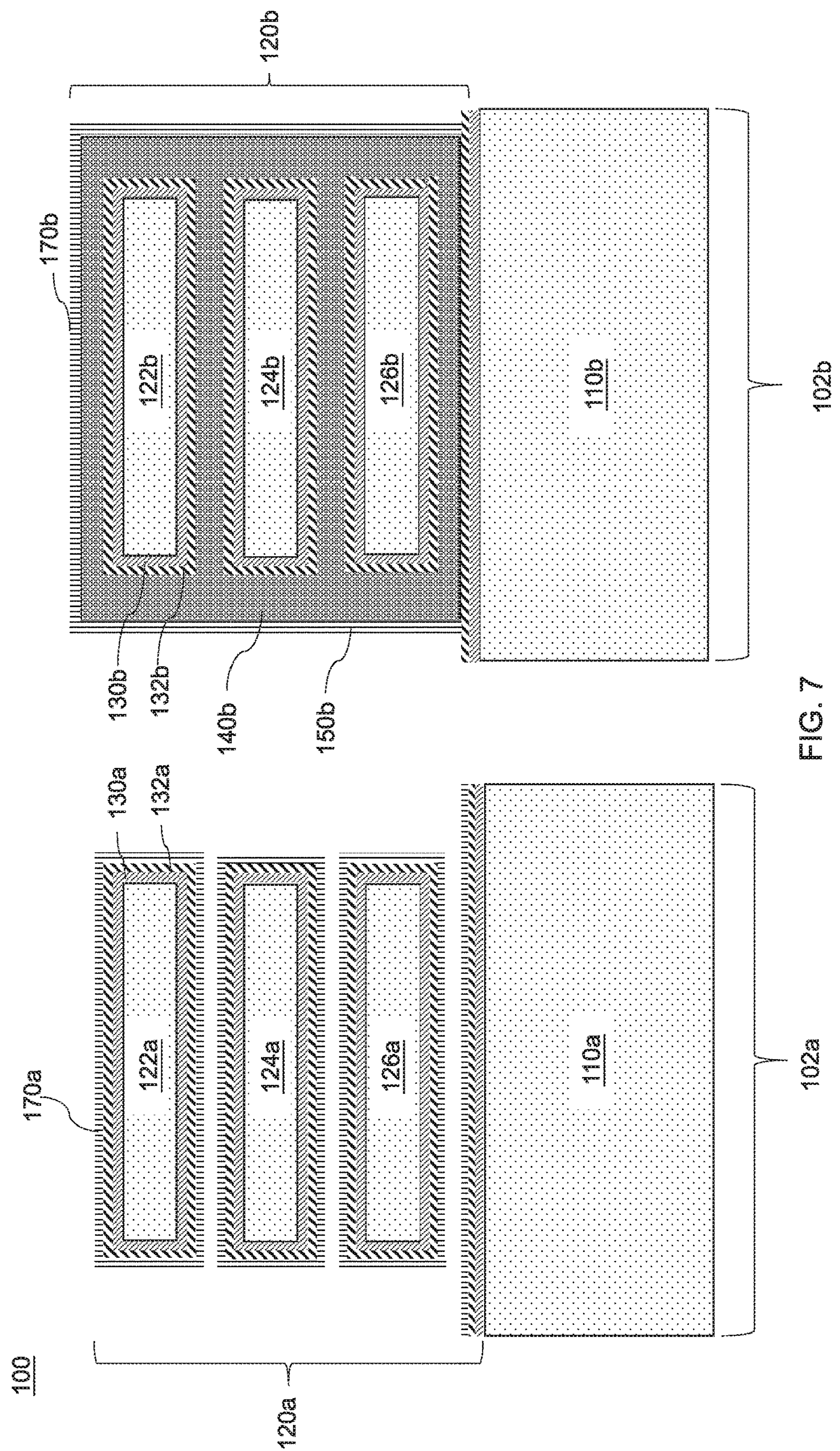
FIG. 7 is a cross-sectional view of layers formed in a given number of deposition cycles after the removal of the material during the fabrication of the semiconductor device, in accordance with an embodiment of the present invention.

Referring to FIG. 7, a metal oxide layer 170*a* is formed around the dielectric material 132*a* and a metal oxide layer 170*b* is formed on the dielectric layer 150*b*. The metal oxide layers 170*a* and 170*b* can be formed in a given number of deposition cycles to achieve thicknesses corresponding to a given Vt shift and low drive-in temperature, based on the thickness of the dielectric material in the layer 130*a*. For example, if the thickness of the dielectric material 132*a* is about 1 nm, the metal oxide layers 170*a* and 170*b* can be formed in about five cycles to achieve a Vt shift of about 150 mV. In one embodiment, the metal oxide layers 170*a* and 170*b* include transition metal oxides, such as those described above with reference to FIG. 4.

The metal oxide layers 170*a* and 170*b* can each have a thickness of about 0.3 nm to about 1 nm, thereby reducing the inter-channel spacing by about 0.6 nm to about 2 nm.

Figure 8:
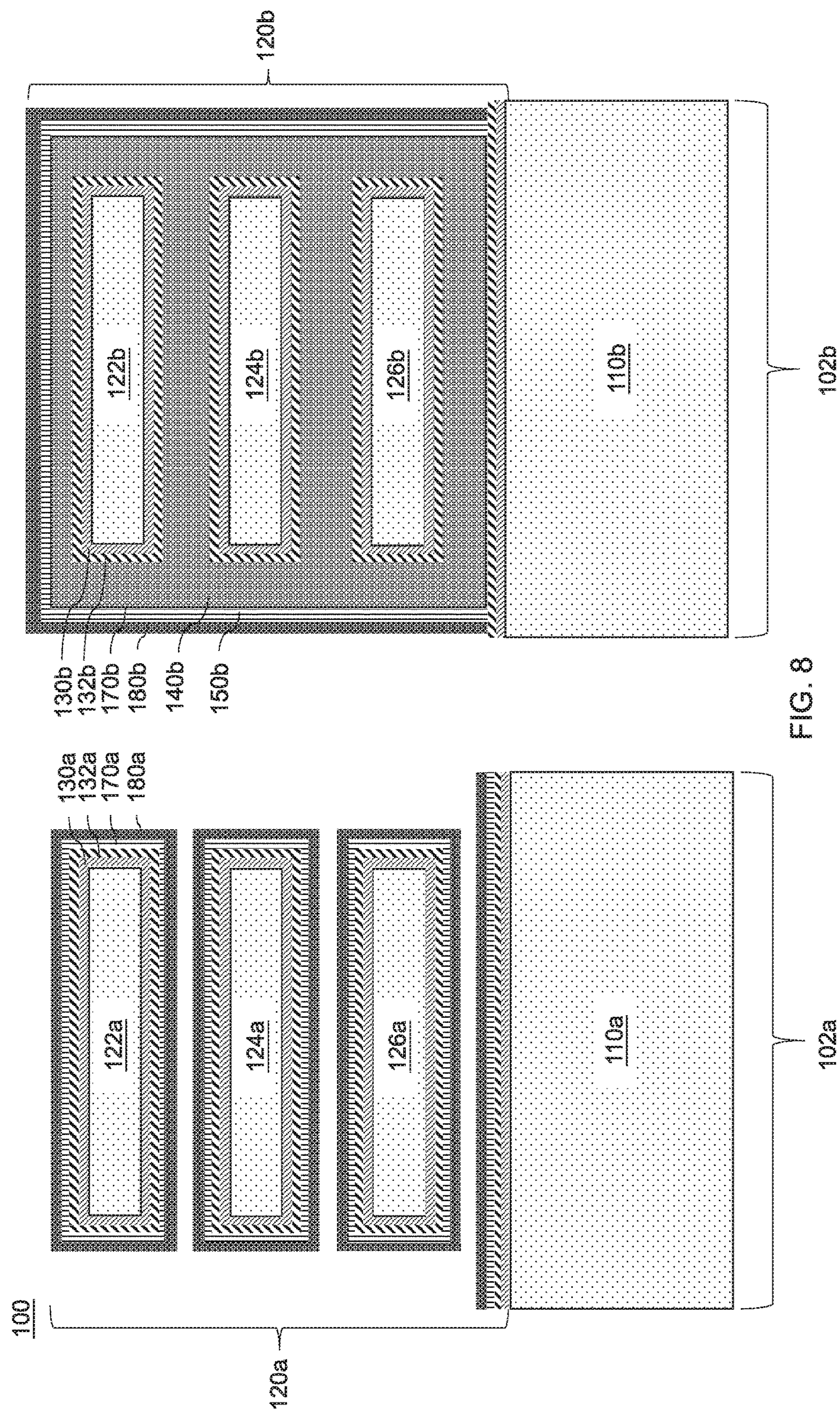
FIG. 8 is a cross-sectional view of additional layers formed on the layers formed in the given number of deposition cycles, in accordance with an embodiment of the present invention.

Referring to FIG. 8, a protective layer 180*a* is formed on the dielectric layer 170*a* and a protective layer 180*b* is formed on the metal oxide layer 170*b*. In one embodiment, the protective layers 180*a* and 180*b* include Mo—TiN. However, the protective layers 180*a* and 180*b* can include any suitable material in accordance with the embodiments described herein. For example, the protective layers 180*a* and 180*b* can include Mo—TaN, Mo—TiAlC, etc.

At least the protective layer 180*a* can have a thickness between about 1 nm to about 2 nm 1.5 nm. More specifically, at least the protective layer 180*a* can have a thickness of about 1.5 nm, thereby reducing the inter-channel spacing by about 3 nm.

Figure 9:
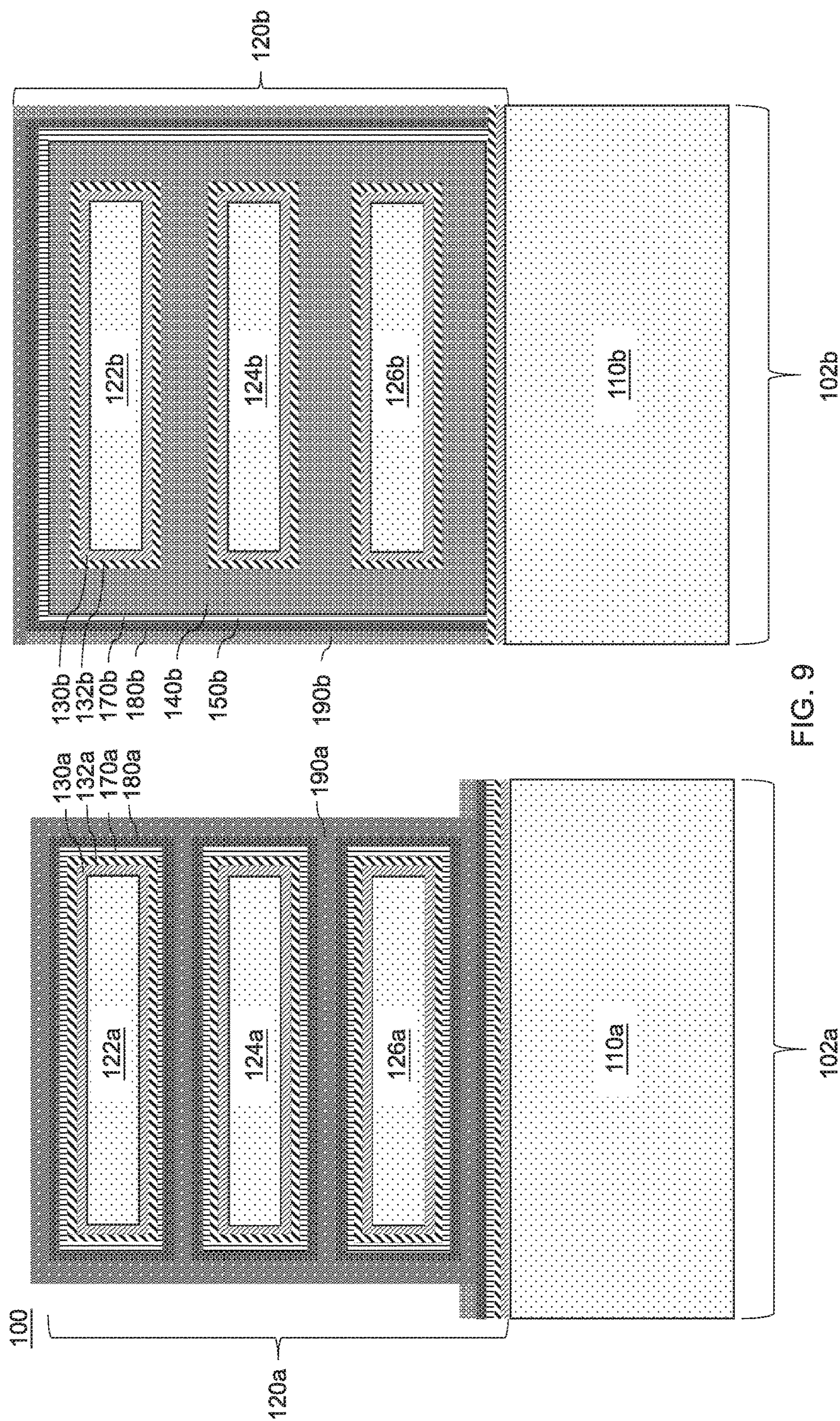
FIG. 9 is a cross-sectional view of material formed within gaps in the gate stacks during the fabrication of the semiconductor device, in accordance with an embodiment of the present invention.

Referring to FIG. 9, a layer 190*a* is formed on the protective layer 180*a* and a layer 190*b* is formed on the protective layer 180*b*. In one embodiment, the layers 190*a* and 190*b* include a Si material (e.g., amorphous Si). The layer 190*a* has a thickness that pinches off the gaps between the channels 122*a*-126*a*.

An anneal process can then be performed after forming the layers 190*a* and 190*b*. As described above, the thickness of the dielectric material 132*a* and 132*b* is less than that of the total thickness. This allows the anneal process to be performed at a temperature lower than about 970 degrees Celsius, which is the anneal temperature used in conventional implementations. For example, in one embodiment, the anneal process can be performed at a temperature of about 875 degrees Celsius. Any suitable anneal process (e.g., LSA) can be performed in accordance with the embodiments described herein.

Figure 10:
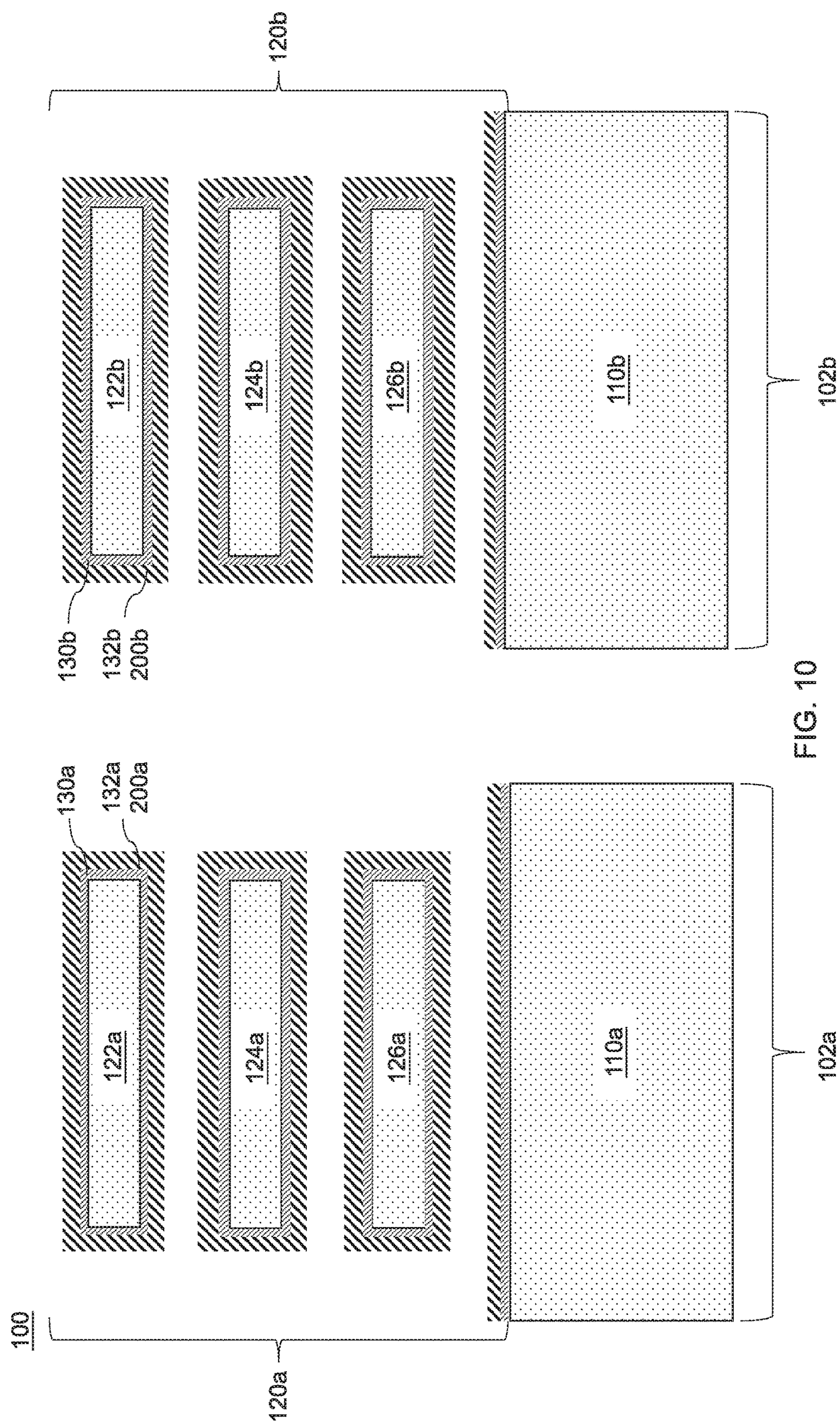
FIG. 10 is a cross-sectional view of dielectric material formed during the fabrication of the semiconductor device, in accordance with an embodiment of the present invention.

Referring to FIG. 10, layers 170*a*-190*a* are removed from the GAA FET device 102*a*, layers 140*b*, 150*b* and 170*b*-190*b* are removed from the GAA FET device 102*b*, and dielectric materials 200*a* and 200*b* are formed on the dielectric materials 132*a* and 132*b*, respectively. The dielectric materials 200*a* and 200*b* correspond to a second portion of dielectric material formed on the dielectric materials 132*a* and 132*b* during the second deposition process to complete the formation of the dielectric material on the ILs 130*a* and 130*b*. The dielectric materials 200*a* and 200*b* can include the same dielectric material used to form the dielectric materials 132*a* and 132*b* (e.g., a high-k dielectric material). Thus, in the embodiment in which the combined thickness of the dielectric material formed on the ILs 130*a* and 130*b* is between about 0.5 nm to about 1.5 nm and the dielectric materials 132*a* and 132*b* each have a thickness between about 0.5 nm to about 2 nm, the dielectric materials 200*a* and 200*b* can each have a thickness between about 0.5 nm to about 1 nm. More specifically, in the embodiment in which the combined thickness is about 2 nm and the dielectric materials 132*a* and 132*b* each have a thickness of about 1 nm, the dielectric materials 200*a* and 200*b* can each have a thickness of about 1 nm.

Figure 11:
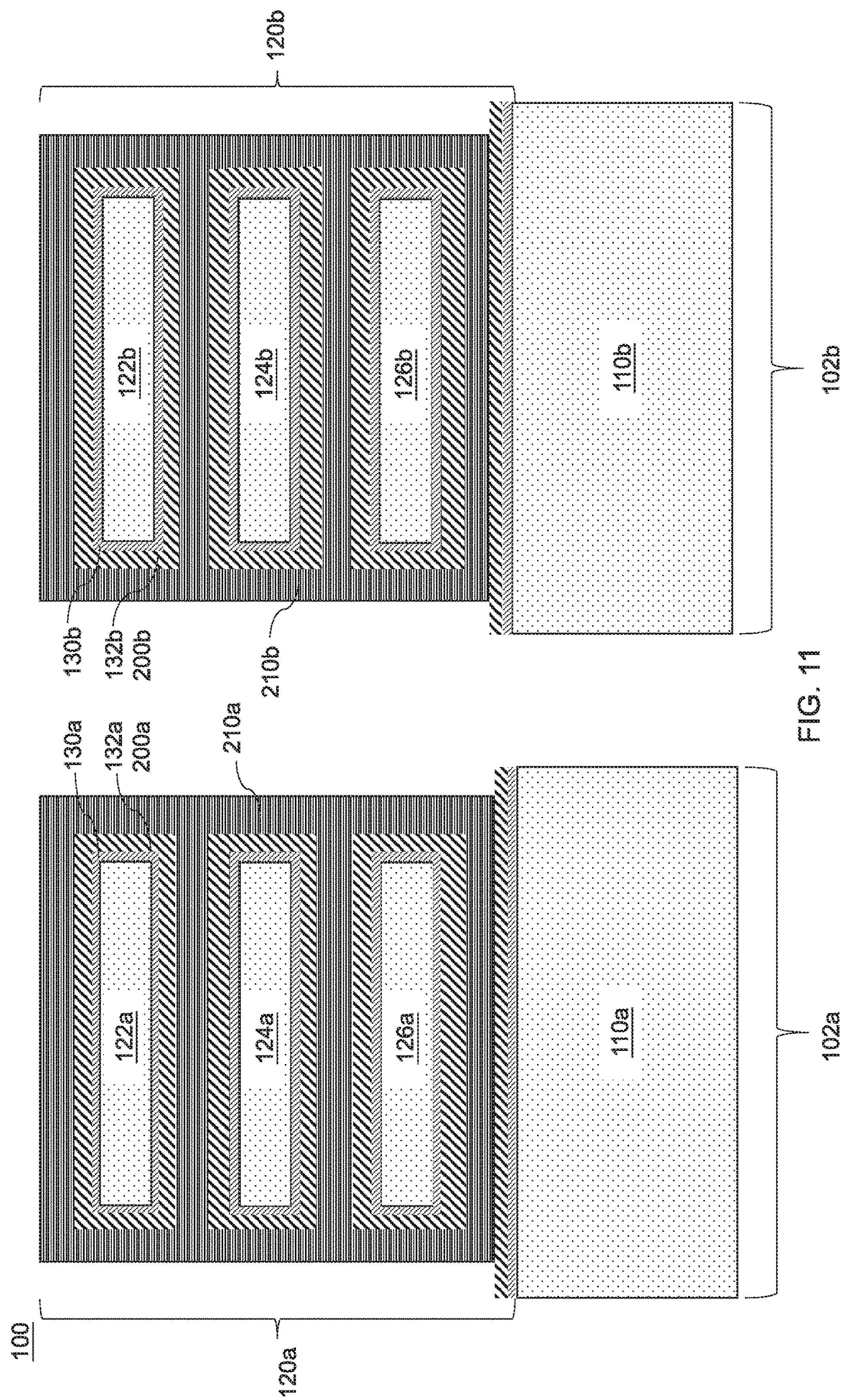
FIG. 11 is a cross-sectional view of a work function metal formed within gaps in the gate stacks during the fabrication of the semiconductor device, in accordance with an embodiment of the present invention.

Referring to FIG. 11, a work function metal 210*a* is formed on the dielectric material 200*a* and a work function metal 210*b* is formed on the dielectric material 200*b*. The work function metal can include any suitable metal and can be formed from using any suitable technique in accordance with the embodiments described herein.

Having described preferred embodiments of a semiconductor device and a method of fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:

a first gate-all-around field-effect transistor (GAA FET) device including a first vertical gate stack having a plurality of first channels, first interfacial layers formed around the first channels, and a number of first dielectric material layers including a high-k dielectric formed around the first interfacial layers, the first GAA FET including a first threshold voltage;

a second GAA FET device including a second vertical gate stack having a plurality of second channels, second interfacial layers formed around and in contact with the second channels, second gate dielectric material layers formed around and in contact with the second interfacial layers including a same number of dielectric material layers as the first dielectric material layers, one of which being a high-k dielectric layer, and a gate conductor on and in contact with the second gate dielectric material layers, the second GAA FET including a second threshold voltage;

wherein:

the first and second channels have a thickness between about 4 nm and about 8 nm;

the first and second interfacial layers have a thickness between about 0.5 nm and about 1.5 nm;

the first dielectric material layers have a combined thickness between about 1 nm and about 3 nm;

the second vertical gate stack having diffused atoms of a metal from an anneal process; and the first threshold voltage is different than the second threshold voltage.

2. The device of claim 1, wherein the first dielectric material layers have a thickness between about 0.5 nm and about 1 nm.

3. The device of claim 1, wherein the first dielectric material layers are formed directly around the first interfacial layers.

4. The device of claim 1, wherein the first vertical gate stack further includes a work function metal formed around the first dielectric material layers.

* * * * *